US005327094A

United States Patent [19]

Vaughan et al.

[11] Patent Number: 5,327,094

[45] Date of Patent: Jul. 5, 1994

[54] JITTER SUPPRESSION IN CROSSED-FIELD AMPLIFIER BY USE OF FIELD EMITTER

[75] Inventors: J. Rodney M. Vaughan, Redwood City, Calif.; Kenneth F. Ramacher; Edward M. Doyle, both of Montoursville, Pa.

[73] Assignee: Litton Systems, Inc., Beverly Hills, Calif.

[21] Appl. No.: 989,090

[22] Filed: Dec. 11, 1992

[51] Int. Cl.[5] .......... H03F 3/54; H01J 25/50

[52] U.S. Cl. .......... 330/47; 315/39.51

[58] Field of Search .......... 315/39.3, 39.51, 39.63, 315/39.57; 330/42, 47, 48

[56] References Cited

U.S. PATENT DOCUMENTS 4,677,342 6/1987 MacMaster et al. .......... 315/39.3
4,700,109 10/1987 MacPhail .......... 315/39.3
4,814,720 3/1989 MacPhail .......... 330/47
4,894,586 1/1990 Crager et al. .......... 315/39.51

*Primary Examiner*—Steven Mottola

*Attorney, Agent, or Firm*—Graham & James

[57] ABSTRACT

A crossed-field amplifier is provided which has an anode and a cathode creating an electric field across a magnetic field formed in an interaction area. A field emitter is disposed within a slot formed on an outer surface of the cathode. The field emitter emits an electron current in response to the electric field to provide priming electrons for improving the start up time of the amplifier. The electron current produced by the field emitter has been shown to initiate secondary emissions of electrons from the cathode to reduce irregular start-up or "jitter" typically experienced with the amplifier at low pulse repetition frequencies. In an alternative embodiment of the invention, a thermionic emitting filament is disposed in a space between adjacent anode vanes of the amplifier. The filament emits electrons in response to an external power source. A portion of the emitted electrons tend to impact the anode vanes, creating x-rays which impact the cathode surface to initiate secondary emissions of electrons.

23 Claims, 4 Drawing Sheets

JITTER SUPPRESSION IN CROSSED-FIELD AMPLIFIER BY USE OF FIELD EMITTER

BACKGROUND OF THE INVENTION

1. Field of the Invention

This invention relates to a crossed-field amplifier and, more particularly, to an electron emitting device used within a crossed-field amplifier to reduce amplifier jitter caused by stopping and restarting the amplifier.

2. Description of Related Art

Crossed-field amplifiers (CFAs) have been used for several years in electronic systems that require high RF power, such as radar systems. A CFA operates by passing an RF signal through a high voltage electric field formed between a cathode and an anode. The cathode emits electrons which interact with an RF wave as it travels through a slow-wave path provided in the anode structure surrounding the cathode. The RF wave is guided by a magnetic field, which crosses the electric field perpendicularly. Crossed-field amplifiers are disclosed in U.S. Pat. No. 4,700,109 issued Oct. 13, 1987, to MacPhail, and U.S. Pat. No. 4,814,720, issued Mar. 21, 1989, to MacPhail et al., both assigned to the common assignee, and which are incorporated herein by reference.

In some applications, it is desirable to operate the CFA in a pulsed mode in which the CFA is repeatedly turned on and off. If used in a radar system, accuracy of the pulse timing is critical to obtaining accurate return information. To start a CFA, there must exist a small number of electrons in the interaction region in order to prime the operation of the cathode. These priming electrons come from natural sources, such as residual radioactivity, electron storage from preceding pulses, cosmic rays, etc. The priming electrons impact the cathode structure causing secondary emissions of electrons from the cathode surface, further resulting in a cascade of electrons flowing in a beam through the interaction region. At relatively high pulse repetition frequencies, a large number of electrons remain in the interaction region after the CFA has been turned off. These remaining electrons prime the CFA to rapidly restart the secondary emission process. However, at low pulse repetition frequencies the electrons in the interaction region dissipate into the anode structure, leaving an absence of electrons to prime the CFA upon restart. Although the natural source electrons will eventually start the CFA, the start-up time can not be determined with certainty. Thus, the restart of the CFA at low pulse repetition frequencies is highly irregular, and is a phenomenon known as "jitter."

Solutions to the jitter problem have centered on maintaining a supply of electrons in the interaction region during the period in which the CFA is turned off. One such solution involves the use of a bias circuit which holds the electrons in the interaction region between the cathode and the anode when the CFA is turned off. The bias circuit is disclosed in U.S. Pat. No. 4,894,586, issued Jan. 16, 1990, by Crager et al., which is assigned to the common assignee. The bias circuit supplies a negative DC voltage to the cathode which holds the electrons within the interaction region. A significant drawback of this method is that a power supply and transformer are required to supply and regulate the DC voltage. The addition of the power supply increases the complexity of the CFA, and the DC voltage must be insulated from the cathode pulse voltage, which is typically more than 10,000 volts.

Thus, a solution to the jitter problem is sought that does not rely on external power sources, or in which the external power source is displaced away from the cathode.

SUMMARY OF THE INVENTION

Accordingly, an object of this invention is to establish a method for improving the starting characteristics of a crossed-field amplifier, and minimize the "jitter" problem.

Another object of this invention is to provide a device which will improve the starting characteristics of a crossed-field amplifier which does not rely on the use of an external power source.

A further object of this invention is to provide a device which will improve the starting characteristics of a crossed-field amplifier which relies on a power source displaced away from the cathode of the amplifier.

Accomplishing these and other objects, there is provided a field emitter embedded in the cathode of the crossed-field amplifier. The field emitter provides a plurality of sharp points which emit electrons in response to the electric field provided between the cathode and the anode of the CFA. The electrons produced by the field emitter help to restart the CFA by providing a priming source to begin secondary electron emission. The field emitter comprises a silicon block having tantalum disilicide fibers grown on a face of the block. The silicon block is disposed within a slot formed on the cathode surface adjacent to the RF input port of the CFA at the beginning of the interaction region. The fibers provide the sharp points which emit the priming electrons. By disposing the field emitter adjacent to the RF input port of the CFA, the priming electrons flow through the interaction region to begin secondary emission.

Empirical tests show that a crossed-field amplifier having a field emitter of the present invention is capable of reducing the maximum starting delays of the CFA from values above 3,000 nanoseconds to less than 30 nanoseconds.

In an alternative embodiment of the present invention, a thermionic emitting filament is disposed in a space provided between the anode vanes of the CFA. The filament lies parallel to a central axis of the cathode. By applying a low voltage to the filament, a number of electrons can be thermionically emitted. Although the filament is not disposed in close proximity to the cathode, the RF wave which is input to the CFA forms voltage differentials between the separate anode vanes. This voltage differential would accelerate the electrons emitted by the filament, which strike the vanes at velocities corresponding to several hundred volts. These impacts generate x-rays which travel at line of sight, many of which impacting the cathode surface. These impacts with the cathode cause the ejection of photoelectrons, thus starting the secondary emission process. Although the thermionic filament relies on an external power source, the power source is provided at the anode region, which is at close to ground potential, rather than at the cathode which has a far greater voltage potential. Thus, insulating the filament voltage from the cathode pulse voltage is simplified.

A more complete understanding of the device for suppressing jitter in a crossed-field amplifier will be afforded to those skilled in the art, as well as a realization of additional advantages and objects thereof, by consideration of the following Detailed Description of the Preferred Embodiment. Reference will be made to the appended sheets of drawings, which will be first described briefly.

DESCRIPTION OF THE PREFERRED EMBODIMENTS

Figure 1:
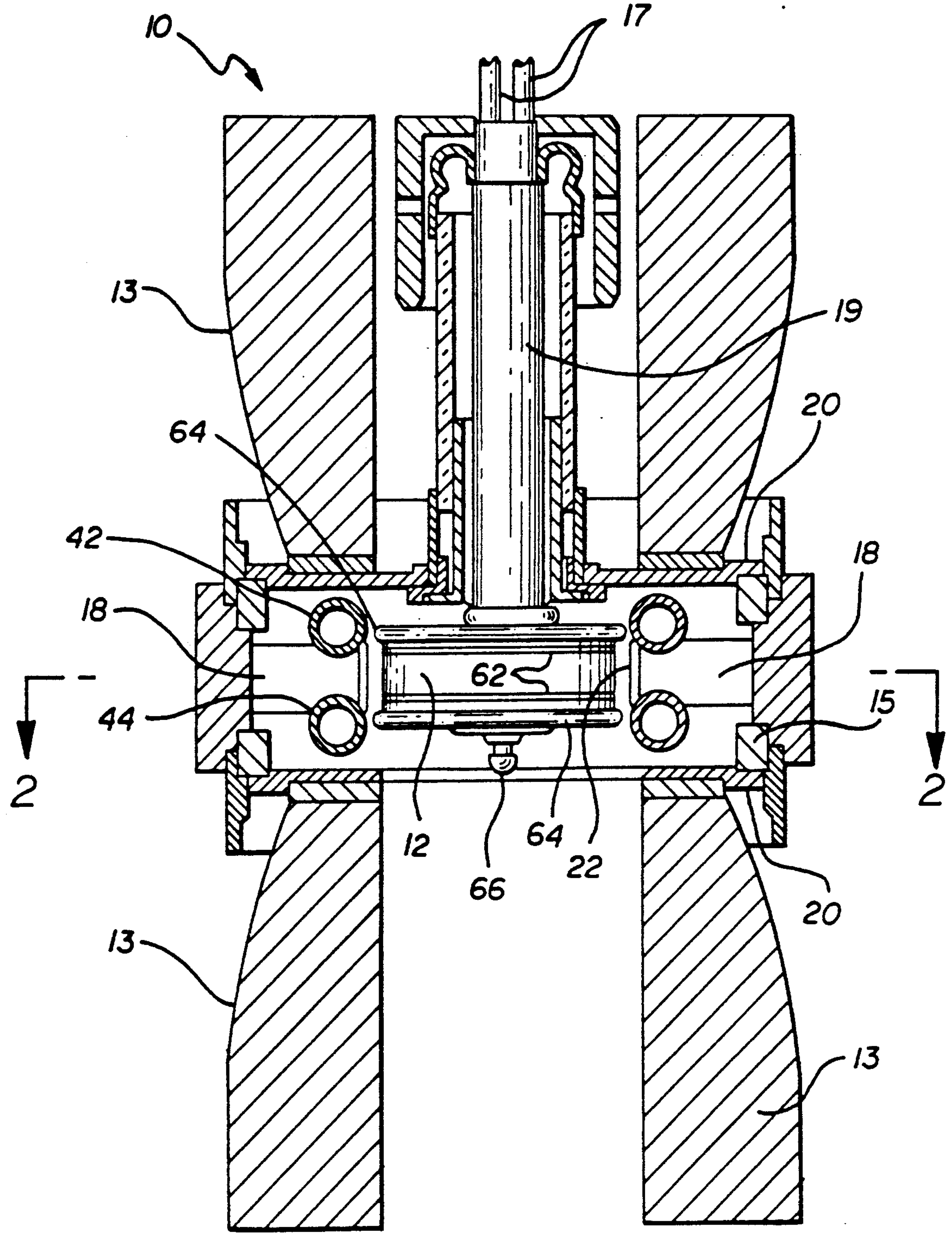
FIG. 1 is a cross-sectional side view of a crossed-field amplifier.

Referring now to the drawings, FIG. 1 shows a crossed-field amplifier 10 formed between a pair of hollow, cylindrically shaped permanent magnets 13. The pair of magnets 13 are mounted above and below a body ring 15 of the CFA, which forms part of the anode as will be fully described below. The body ring 15 is sealed by covers 20 which secure to the magnets 13.

Extending radially inward from the inner surface of the body ring 15 is a plurality of anode vanes 18 which are attached thereto, such as by brazing. The vanes are electrically connected by a pair of toroidally shaped helical spring coils 42 and 44 which have right and left hand windings, respectively. The coils 42 and 44, vanes 18 and body ring 15 are all electrically connected together to form the anode. Although a wire coil helix 42, 44 is shown in FIG. 1, it is also known in the art to use a helix which is machined into the anode vanes 18. The inventive concepts described herein are equally applicable to a either CFA having a wire coil or machined helix.

A cathode 12 is disposed at the center of the body ring 15 and is surrounded by the radially extending anode vanes 18. The cathode 12 has a cylindrically shaped cathode emitter surface 14, a spacer 62 on each side, and end shield 64 on each side of the spacers. The emitting surface 14 is generally formed of beryllium, and the spacers 62 are generally formed of beryllium or copper. A cathode terminal 66 is provided with a high negative voltage, such as 13 KV, through a central bore in lower magnet 13. A mechanical support rod 19 secures to the upper end shield 64, providing structural support for the cathode 12. A plurality of coolant tubes 17 extend axially through the mechanical support rod 19, to provide a coolant fluid to maintain the cathode 12 at a fixed temperature.

Figure 2:
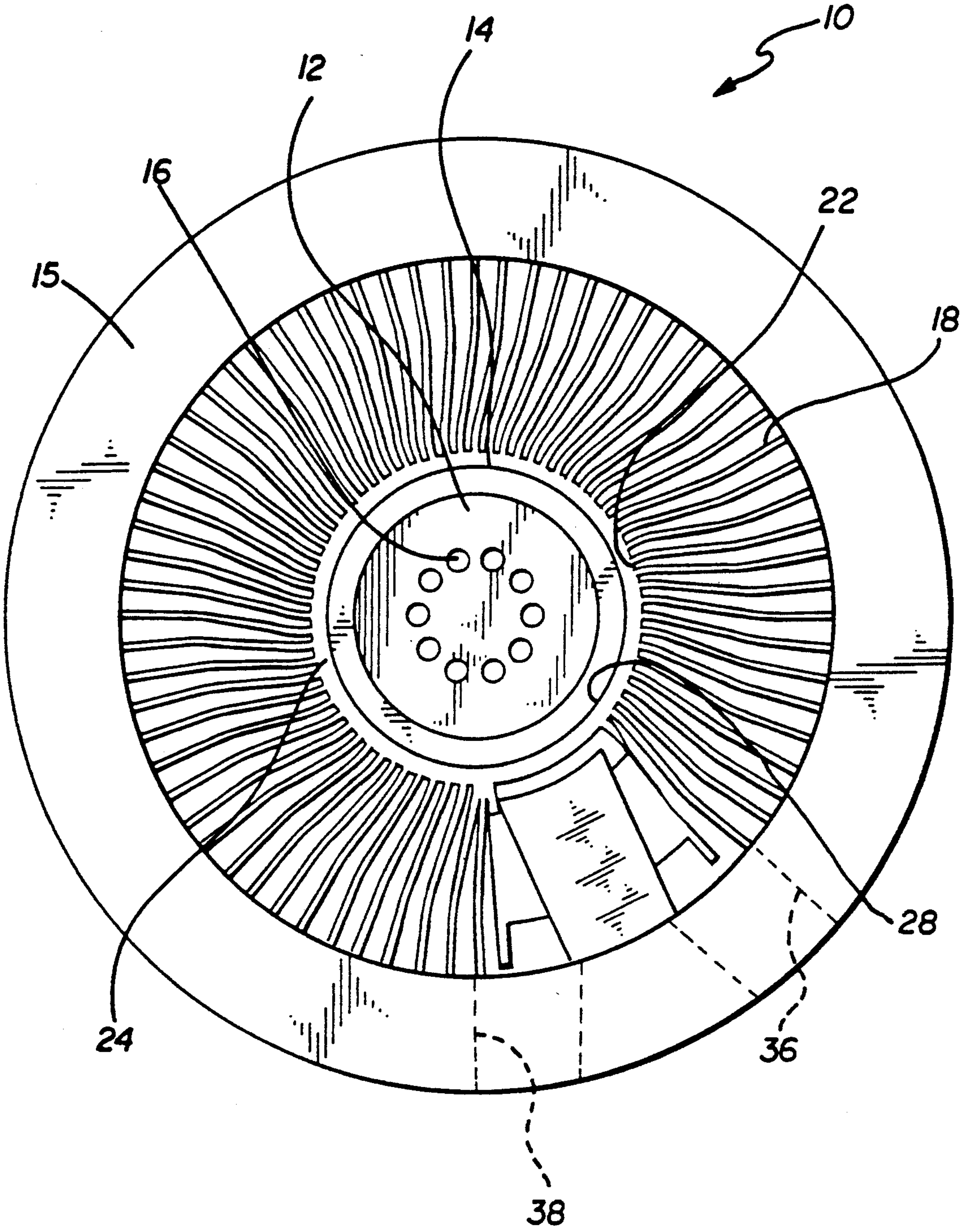
FIG. 2 is a cross-sectional top view of the crossed-field amplifier of FIG. 1 showing the field emitter of the present invention, as taken through the section 2-2.
Figure 3:
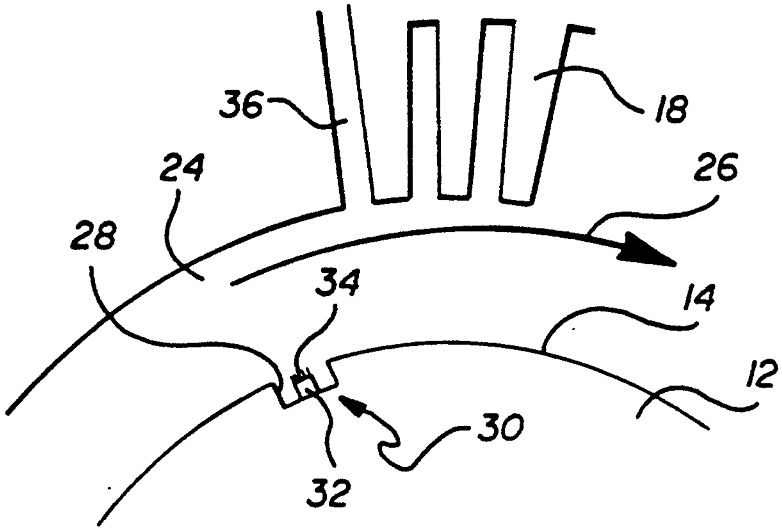
FIG. 3 is an enlarged top view of the cathode surface showing the position of the field emitter array.

Referring now to FIG. 2, there is shown a cross-sectional top view of the CFA structure shown in FIG. 1. The view shows the cathode 12 surrounded by the plurality of radially extending anode vanes 18 which are secured to the body ring 15. A plurality of coolant holes 16 extend axially through the cathode 12 which join to the coolant tubes 17 described above. An RF input port 36 and an RF output port 38 extend through the body ring 15 to provide a input and output path for an RF signal provided to the CFA, respectively. An interaction region 24 is provided between the cathode surface 14 and the tips 22 of the anode vanes 18.

In operation, a high negative voltage is applied to the cathode 12 relative to the anode vanes 18. The voltage causes a flow of electrons between the cathode 12 and the anode vanes 18. The magnets 13 provide a magnetic field which lies perpendicular to the electric field formed within the CFA structure 10. The magnetic field causes the electrons to spin into orbit around the cathode structure, during which they interact with the RF signal which enters the input port 36. Energy from the orbiting electrons is exchanged with the RF signal, causing the signal to become amplified. An amplified RF signal exits the CFA 10 through the output port 38.

As is known in the art, the electrons which are caused to flow within the interaction region 24 are produced through a process of secondary emission. The cathode surface 14 utilizes beryllium oxide which emits secondary electrons after being impacted by priming electrons. An oxygen source may be provided to the CFA to replenish the oxygen which becomes depleted from the cathode surface 14 during the secondary emission process. The priming electrons which initiate the secondary emission process typically originate from natural sources which are generally sufficient to initiate the secondary emission process, since an extremely small amount of electron current is necessary to start the beam. However, at relatively low pulse rate frequencies, such as below 10 Hz, delays in CFA start-up in the microsecond range may be experienced.

Figure 4:
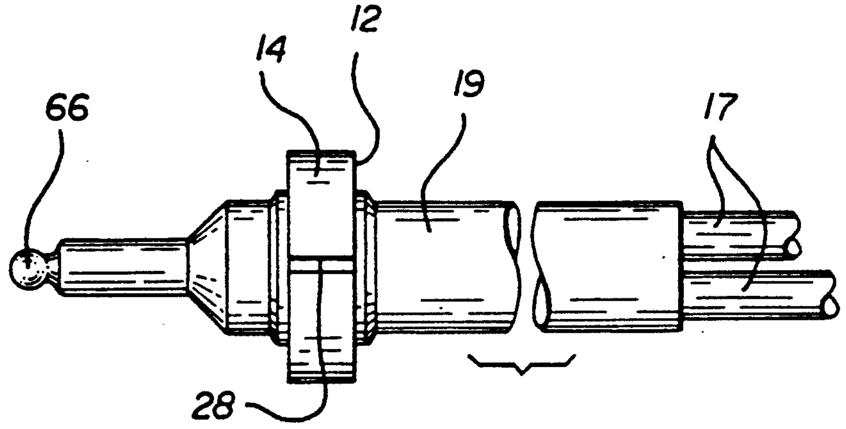
FIG. 4 is a side view of the cathode structure showing the slot in the cathode for placement of the field emitter array.

To provide a source of priming electrons, this invention discloses the use of a field emitter array 30. The field emitter 30 is disposed within a slot 28 provided in the cathode surface 14. The slot 28 is best shown in FIG. 4, and extends parallel to the axis of the cathode 12. For optimum results, the field emitter array 30 and slot 28 are disposed adjacent to the RF input port 36. The field emitter 30 supplies a source of priming electrons in response to the operating voltage of the CFA.

The field emitter 30 comprises a semiconductor base structure 32 on which nearly parallel fibers of tantalum disilicide ($TaSi_2$) extend. The base structure 32 may be formed of silicon. The density of the fibers is about 1 million per square centimeter with an average fiber-to-fiber spacing of about 8-10 micrometers. The points of the tantalum disilicide fibers extend to just below the cathode surface 14, facing the RF input port 36. Since the CFA 10 is typically operated with an oxygen background, a thin film of gold may be sputtered onto the top surface of the field emitter 30 to prevent the fiber tips from oxidizing. The field emitter 30 can yield an electric field of approximately 20 kilovolts per centimeter upon device turn-on.

In operation, a CFA 10 having a field emitter 30 of the present invention consistently reduced the peak jitter by roughly two orders of magnitude, from several microseconds down to the 30 nanosecond region. The RMS jitter was also improved, but not in the same ratio as the peak jitter. The reason for this distinction appears to be that the field emitter clamps at an upper limit of about 30 nanoseconds on the starting delay, and that the other "natural" mechanisms will sometimes have already started the secondary emission before this occurs. These starting times will be spreaded randomly over the first 30 nanoseconds, thus contributing to the RMS jitter. However, the use of the field emitter 30 limits the peak jitter value.

Figure 5:
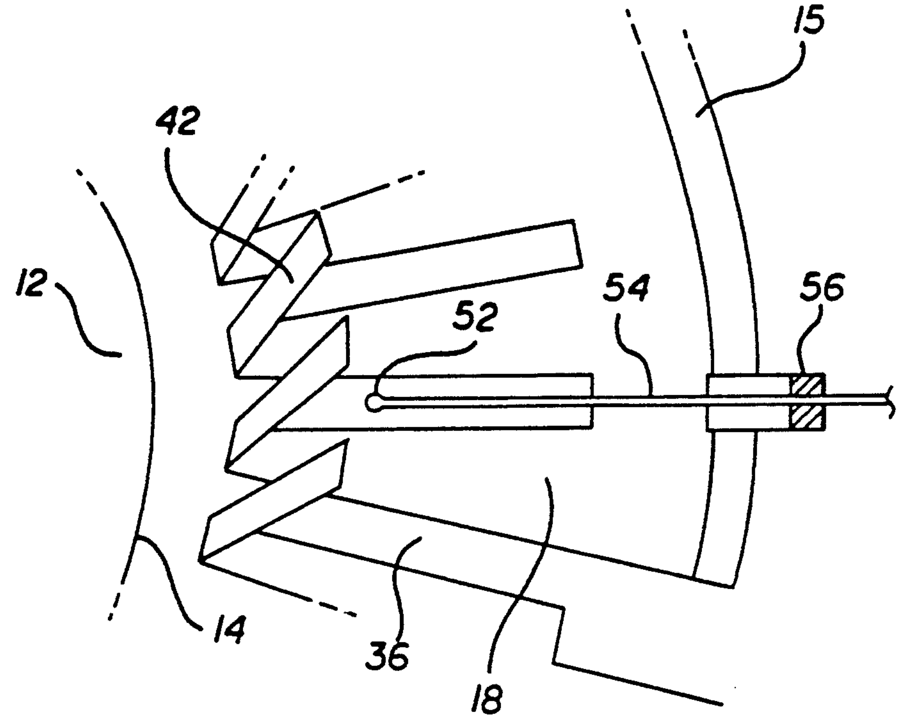
FIG. 5 is an enlarged top view of a crossed-field amplifier showing the position of the thermionic filament adjacent to an anode vane.
Figure 6:
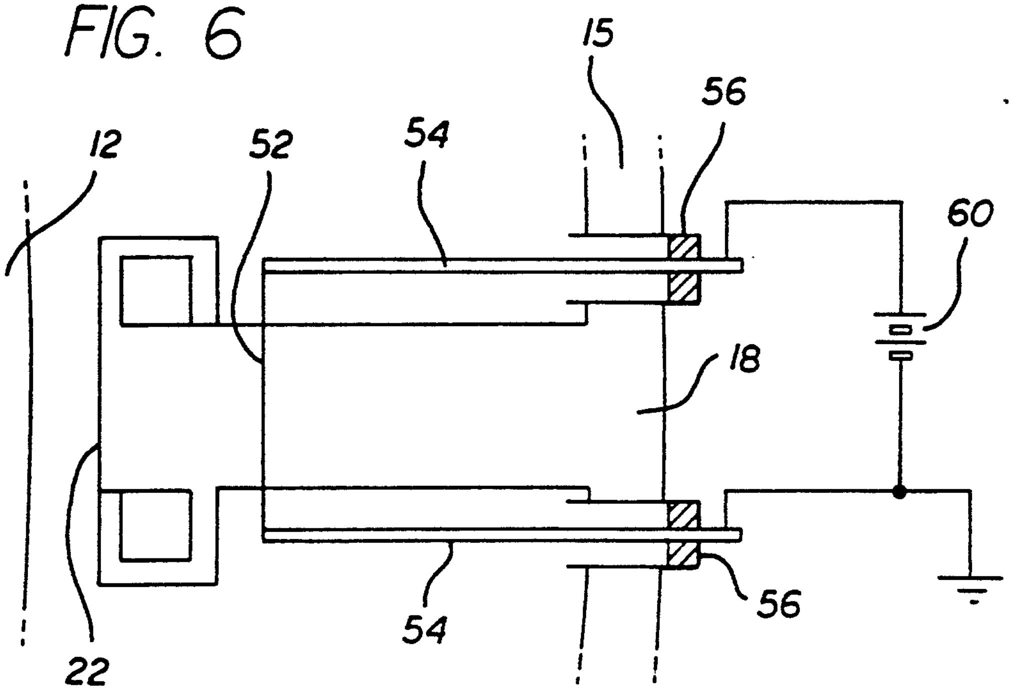
FIG. 6 is a side view of the anode vane of FIG. 5 showing the thermionic filament.

Referring now to FIGS. 5 and 6, there is shown an alternative embodiment of this invention. In this embodiment, a filament 52 is disposed in the space 25 between adjacent anode vanes 18. The filament 52 lies parallel to an axis formed by the cathode structure 12. To suspend the filament 52 in place within the CFA 10, parallel support rods 54 extend radially inward from the body ring 15 of the CFA 10. The support rods 54 extend through the body ring 15 via insulators 56. An electrical conductor 58 extends through the support rods 54, connecting the filament 52 to an external power source 60.

When power is supplied to the filament 52, electrons are emitted by a thermionic process. Unlike the field emitter 30 described above, the electrons thermionically emitted from the filament 52 are distant from the cathode surface 14. Nevertheless, these electrons can contribute to the secondary emission process. The application of the RF signal into the RF input port 36 creates a voltage differential between adjacent ones of the anode vanes 18. This voltage causes an acceleration of the emitted electrons into the adjacent anode vanes 18 at velocities corresponding to several hundred volts. These electron impacts generate x-rays which travel along a line of sight within the CFA 10 unimpeded by either electric or magnetic forces. These x-rays are too slight to be detected outside of the CFA structure. A portion of the x-rays will ultimately impact the cathode surface, causing the ejection of photoelectrons which in turn serve as the priming electrons which begins the secondary emission process. Although this x-ray transfer method is relatively inefficient, the required electron current to begin secondary emission is so small that the filament emission would be successful in reducing jitter.

By providing the filament 52 in the anode structure, rather than adjacent to the cathode 12, this embodiment avoids the electrical isolation problem experienced in the prior art. As with the field emitter 30, the filament 52 should be disposed as near as possible to the RF input port 36 so as to maximize the acceleration of emitted electrons. The filament 52 may be a straight wire or a helix of tungsten or thoriated tungsten or other emissive metal. Alternatively, a filament 52 may be coated with an electron emissive oxide.

Having thus described a preferred embodiment of a device for use in a crossed-field amplifier for reduction of jitter, it should now be apparent to those skilled in the art that the aforestated objects and advantages for the within system have been achieved. It should also be appreciated by those skilled in the art that various modifications, adaptations and alternative embodiments thereof may be made within the scope and spirit of the present invention. For example, while the invention shows the use of a single field emitter 30 or filament 52 disposed adjacent to the input port 36, it is also anticipated that a plurality of such electron emitting devices be advantageously used within a CFA.

The present invention is further defined by the following claims:

What is claimed is:

1. In a crossed-field amplifier having an anode and a cathode creating an electric field across a magnetic field in an interaction area, the improvement comprising:

field emitter means connected to said cathode for providing priming electrons in said interaction area upon initiation of said amplifier to enable a fast start-up of said amplifier, wherein said priming electrons are emitted in response to said electric field.

2. The crossed-field amplifier as claimed in claim 1, wherein the field emitter means comprises a semiconductor base having a plurality of fibers extending therefrom, the fibers providing points for emission of electrons in response to said electric field.

3. The cross field amplifier as claimed in claim 1, additionally comprising:

a slot provided in an outer surface of said cathode, said field emitter means being disposed within said slot.

4. The crossed-field amplifier as claimed in claim 3, wherein said slot is disposed adjacent to an RF input port of said amplifier.

5. The crossed-field amplifier as claimed in claim 2, wherein the fibers have a thin film of gold deposited thereon to prevent oxidation.

6. The crossed-field amplifier as claimed in claim 2, wherein the fibers are formed from tantalum disilicide ($TaSi_2$).

7. The crossed-field amplifier as claimed in claim 2, wherein the semiconductor base is formed from silicon (Si).

8. In a crossed-field amplifier having an anode and a cathode creating an electric field across a magnetic field in an interaction area, the improvement comprising:

thermionic emitting means displaced from said cathode providing priming electrons in said interaction area upon initiation of said amplifier to enable a fast start-up of said amplifier, said thermionic emitting means being disposed in a space provided between adjacent anode vanes of said amplifier.

9. The crossed-field amplifier as claimed in claim 8, wherein said thermionic emitting means comprises a filament.

10. The crossed-field amplifier as claimed in claim 8, wherein said thermionic emitting means further comprises a voltage source external to said amplifier.

11. The crossed-field amplifier as claimed in claim 9, wherein said filament is a straight wire.

12. The crossed-field amplifier as claimed in claim 9, wherein said filament is a helix of tungsten.

13. The crossed-field amplifier as claimed in claim 9, wherein said filament is coated with an electron emissive oxide.

14. In a crossed-field amplifier having an anode and a cathode creating an electric field across a magnetic field in an interaction area, the improvement comprising:

means for providing priming electrons to said cathode upon initiation of said amplifier to enable a fast start-up of said amplifier, wherein said priming electrons are emitted in response to said electric field.

15. In a crossed-field amplifier having an anode and a cathode creating an electric field across a magnetic field in an interaction area, the improvement comprising:

means for providing priming electrons to said cathode upon initiation of said amplifier to enable a fast start-up of said amplifier, wherein said means comprises a field emitter having a semiconductor base and a plurality of fibers extending therefrom, the fibers emitting electrons in response to said electric field.

16. The crossed-field amplifier as claimed in claim 15, wherein said fibers are formed from tantalum disilicide ($TaSi_2$).

17. The crossed-field amplifier as claimed in claim 15, additionally comprising a slot provided in an outer surface of said cathode, said field emitter being disposed within said slot.

18. In a cross-field amplifier having an anode and a cathode creating an electric field across a magnetic field in an interaction area, the improvement comprising:

means for providing priming electrons to said cathode upon initiation of said amplifier to enable a fast start-up of said amplifier, wherein said means comprises a thermionic emitting filament displaced from said cathode, said filament adapted to be connected to an external voltage source and emitting electrons in response to said voltage source, said filament being disposed in a space between adjacent anode vanes of said amplifier.

19. The crossed-field amplifier as claimed in claim 18, wherein the filament is a tungsten wire.

20. A crossed-field amplifier, comprising:

a cathode structure having an emitting surface which emits secondary electrons upon impingement of priming electrons incident thereon;

an anode structure surrounding said cathode and comprising a plurality of radially extending vanes; and means for providing said priming electrons to said cathode upon initiation of said amplifier to enable a first start-up of said amplifier, said priming electrons originating from a location separate from said emitting surface of said cathode, said means further comprising a field emitter disposed in a slot provided in said emitting surface, wherein said priming electrons are emitted in response to said electric field.

21. The crossed-field amplifier as claim in claim 20, wherein said field emitter further comprises a semiconductor base and a plurality of fibers extending therefrom, the fibers emitting said priming electrons.

22. A crossed-field amplifier, comprising:

a cathode structure having an emitting surface which emits secondary electrons upon impingement of priming electrons incident thereon;

an anode structure surrounding said cathode and comprising a plurality of radially extending vanes; and means for providing said priming electrons to said cathode upon initiation of said amplifier to enable a fast start-up of said amplifier, said priming electrons originating from a location separate from said emitting surface of said cathode, wherein said means comprises a thermionic emitting filament disposed within said anode structure, said filament adapted to be connected to an external voltage source and emitting electrons in response to said voltage source.

23. The crossed-field amplifier as claimed in claim 22, wherein the filament is disposed in a space between adjacent ones of said anode vanes.

* * * * *